(12) United States Patent
Cho

(10) Patent No.: US 6,894,942 B2
(45) Date of Patent: May 17, 2005

(54) REFRESH CONTROL CIRCUIT AND METHOD FOR SEMICONDUCTOR MEMORY DEVICE

(75) Inventor: Jin Hee Cho, Chungcheongbuk-do (KR)

(73) Assignee: Hynix Semiconductor, Inc., Gyunggi-Do (KR)

(*) Notice: Subject to any disclaimer, the term of this patent is extended or adjusted under 35 U.S.C. 154(b) by 0 days.

(21) Appl. No.: 10/334,298

(22) Filed: Dec. 31, 2002

(65) Prior Publication Data

US 2003/0214870 A1 Nov. 20, 2003

(30) Foreign Application Priority Data

May 17, 2002 (KR) .................................. 10-2002-27519

(51) Int. Cl.⁷ ................................................ G11C 7/00
(52) U.S. Cl. ...................................... 365/222; 365/197
(58) Field of Search ................................ 365/222, 197, 365/194, 189.07

(56) References Cited

U.S. PATENT DOCUMENTS

| | | |
|---|---|---|
| 5,742,554 A | 4/1998 | Fujioka |
| 5,991,218 A | 11/1999 | Kushiyama |
| 6,058,061 A | 5/2000 | Ooishi |
| 6,078,543 A | 6/2000 | Kim |
| 6,173,238 B1 | 1/2001 | Fujisaki |
| 6,195,303 B1 * | 2/2001 | Zheng ........................ 365/222 |
| 6,275,437 B1 | 8/2001 | Kim et al. |
| 6,590,823 B2 * | 7/2003 | Tsukude ...................... 365/222 |

FOREIGN PATENT DOCUMENTS

| | | |
|---|---|---|
| JP | 10-40694 | 2/1988 |
| JP | 2-177081 | 7/1990 |
| JP | 4-38788 | 2/1992 |
| JP | 4-53086 | 2/1992 |
| JP | 4-109491 | 4/1992 |
| JP | 05-101651 | 4/1993 |
| JP | 6-5075 | 1/1994 |
| JP | 6-187796 | 7/1994 |
| JP | 7-122062 | 5/1995 |
| JP | 10-11964 | 1/1998 |
| JP | 11-219599 | 8/1999 |
| JP | 11-339469 | 12/1999 |
| KR | 013963 | 2/1999 |

* cited by examiner

Primary Examiner—Thong Q. Le
(74) Attorney, Agent, or Firm—Marshall, Gerstein & Borun LLP

(57) ABSTRACT

A refresh control circuit and a method for refreshing control of a semiconductor memory device are described. The refresh control circuit includes a sense amplifier control circuit configured to generate a sense amplifier driving signal by selectively applying a first delay time and a second delay time (first delay time+third delay time) in response to a sense amplifier enable signal and a refresh command signal (or refresh fail detect signal), and a sense amplifier driver configured to output a sense amplifier driving voltage by applying the first delay time or the second delay time according to a mode.

14 Claims, 9 Drawing Sheets

REFRESH CONTROL CIRCUIT AND METHOD FOR SEMICONDUCTOR MEMORY DEVICE

TECHNICAL FIELD

The present disclosure relates generally to semiconductor memory devices, and more particularly, to a refresh control circuit and method for a semiconductor memory device.

BACKGROUND

A DRAM performs a refresh operation periodically to restore data stored in a cell to maintain information stored in the cell. However, a number of word lines (row addresses) to be refreshed for a period refresh time is increased according to high integration of the DRAM, and a number of active sense amplifiers and bit lines is also increased. Therefore, the DRAM needs more current in the refresh operation than the normal operation. In this regard, techniques for achieving a high speed refresh operation and low power consumption have been suggested.

Referring to FIG. 1, a conventional refresh control circuit 100 includes an input buffer and command decoder 110, a row address latch circuit 120, a column address latch circuit 130, a row predecoder 140, a column predecoder 150, an internal address counter (refresh counter) 160, a row control circuit 170, a sense amplifier control unit 180, a row decoder 190, a column decoder 200, a sense amplifier 210 and a memory array 220. In the case of an SDRAM composed of four banks, one bank is enabled in the normal operation but the four banks are simultaneously enabled in the refresh operation. When the four banks are enabled at the same time, a large driving capacity is required to sense the bit lines. In addition, a cycle time of an external clock signal is shortened because of a high speed tendency of the DRAM. Accordingly, a RAS cycle time tRCmin (time consumed until all nodes of a core of the DRAM are electrically precharged by precharging a bit line sense amplifier and word lines) is gradually decreased. As a result, a cell having a poor sense amplifier driving capacity cannot restore data in a normal level during the refresh operation.

Referring to FIG. 2, sense amplifier driving signals SAP1 and SAN have a high level in delay time D1, and a sense amplifier driving signal SAP2 maintains a low level when a sense amplifier enable signal SAEN has a high level. A voltage level of a sense amplifier power supply node CSP is transmitted from VDD/2 level to a sense amplifier driving voltage Vcore1 (higher than Vcore2). After delay time D1, the sense amplifier driving signal SAP1 has a low level and the sense amplifier driving signal SAP2 has a high level. Therefore, the voltage level of the sense amplifier power supply node CSP becomes a sense amplifier driving voltage Vcore2 (lower than Vcore1). The sense amplifier 210 is operated during t1 period to sense the bit line. Thus, data stored in the memory cell are refreshed for a predetermined time t1.

However, according to the refresh property, the delay time D1 may be deficient for driving the sense amplifier 210 to the sense amplifier driving voltage Vcore1 level by using the sense amplifier driving signal SAP1. In this case, development of the bit line is abnormally slow in the cell. Thus, the word line is reset in a level lower than a desired level by ΔV. As a result, the cell having the poor refresh property fails to restore data in the refresh operation because of unsatisfactory refresh conditions.

SUMMARY OF THE DISCLOSURE

A refresh control circuit configured to supply a sufficient sense amplifier driving voltage in response to a refresh command signal for cells having a poor refresh property to normally perform a refresh operation is disclosed herein. A refresh control circuit configured to enable cells having a poor refresh property to normally perform a refresh operation by investigating the cells having the poor refresh property in advance and supplying a sufficient sense amplifier driving voltage to the cells in the refresh operation is also disclosed.

In particular, the refresh control circuit for a semiconductor memory device includes: a sense amplifier control circuit configured to generate a sense amplifier driving signal by selectively applying a first delay time and a second delay time (first delay time+third delay time) in response to a sense amplifier enable signal and a refresh command signal; and a sense amplifier driver configured to output a sense amplifier driving voltage by applying the first delay time in a normal operation and the second delay time in a refresh operation. The sense amplifier control circuit includes: a refresh command signal generating unit configured to output a first refresh command signal for selectively applying the first delay time and the second delay time; and a plurality of sense amplifier driving signal generating units configured to generate a driving signal by logically combining the sense amplifier enable signal and the first refresh command signal. The refresh command signal generating unit includes: a first delay unit configured to delay the sense amplifier enable signal for the first delay time; and a second delay unit configured to delay the output from the first delay unit for the third delay time. The first refresh command signal using the first delay time or the second delay time is outputted according to the normal operation and the refresh operation.

Alternatively, the refresh control circuit for a semiconductor memory device includes: a row address comparing unit configured to compare a row address having previously-recorded refresh failure with an internal row address, and to generate a refresh fail detect signal in response to a refresh command signal; and a sense amplifier control unit to output a sense amplifier driving voltage by applying a first delay time in a refresh operation for a general row address and applying a second delay time (first delay time+third delay time) in a refresh operation for the row address having the previously-recorded refresh failure in response to the refresh fail detect signal and a sense amplifier enable signal. Here, the row address comparing unit compares the row address having the previously-recorded refresh failure with the internal row address, and outputs the corresponding refresh fail detect signal.

A refresh control method for a semiconductor memory device is also disclosed herein. The disclosed method includes: generating an internal row address for a refresh operation in response to a refresh command signal; generating a refresh fail detect signal by comparing a row address having previously-recorded failure with the internal row address in a refresh operation; and driving a sense amplifier by supplying an initial sense amplifier driving voltage for the row address having the previously-recorded refresh failure longer than for a general row address in response to the refresh fail detect signal in the refresh operation.

BRIEF DESCRIPTION OF THE DRAWINGS

The disclosure will be described in terms of several embodiments to illustrate its broad teachings. Reference is also made to the attached drawings.

DETAILED DESCRIPTION

The present disclosure will be described in detail with reference to the accompanying drawings. A supply state of a sense amplifier driving voltage supplied to a sense amplifier is controlled to enable cells having a poor refresh property to normally perform a refresh operation. A technique of controlling the supply state of the sense amplifier driving voltage in the whole cells during the refresh operation, and a technique of controlling the supply state of the sense amplifier driving voltage in the cells having the poor refresh property are described herein.

Figure 3:
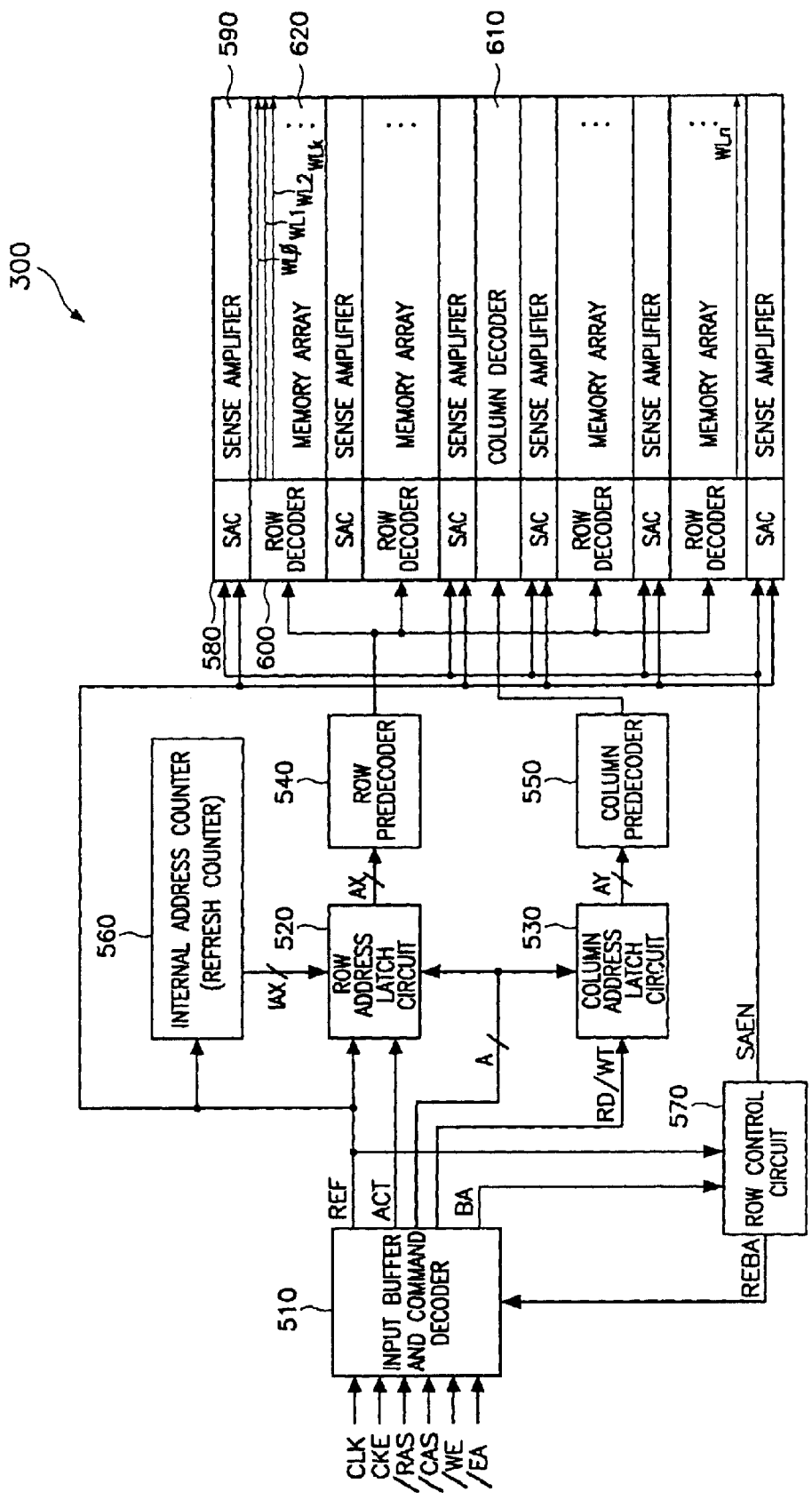
FIG. 3 is a block diagram illustrating a refresh control circuit for a semiconductor memory device.

FIG. 3 is a block diagram illustrating the refresh control circuit for a semiconductor memory device 300. As illustrated in FIG. 3, the refresh control circuit 300 includes an input buffer and command decoder 510, a row address latch circuit 520, a column address latch circuit 530, a row predecoder 540, a column predecoder 550, an internal address counter (refresh counter) 560, a row control circuit 570, a sense amplifier control unit 580, a sense amplifier 590, a row decoder 600, a column decoder 610 and a memory array 620.

The input buffer and command decoder 510 receives an external address EA, a clock signal CLK and control signals CKE, /RAS, /CAS and /WE from an external apparatus. The input buffer and command decoder 510 generates and outputs command signals REF, ACT, and RD/WT, and a bank address BA. The input buffer and command decoder 510 also outputs an address A by buffering the external address EA.

The internal address counter 560 generates an internal row address IAX at a falling edge of the refresh command signal REF. The row address latch circuit 520 outputs a row address AX according to the refresh command signal REF and the active command signal ACT. The column address latch circuit 530 outputs a column address AY according to the read/write signal RD/WT. The row predecoder 540 predecodes the row address AX from the row address latch circuit 520, and the column predecoder 550 predecodes the column address AY from the column address latch circuit 530. The row control circuit 570 receives the bank address BA and the refresh command signal REF, and generates a sense amplifier enable signal SAEN, which is a row side (word line) control signal and a precharge signal REBA for precharging after the refresh operation.

The sense amplifier control unit 580 drives the sense amplifier 590 in response to the refresh command signal REF and the sense amplifier enable signal SAEN. The sense amplifier 590 sequentially receives sense amplifier driving voltages Vcore1 and Vcore2 from the sense amplifier control unit 580, and performs an amplifying operation. The row decoder 600 enables a specific row (word line) according to the output signal from the row decoder 540, and the column decoder 610 enables a column (bit line) according to the output signal from the column predecoder 550. The memory array 620 is composed of a plurality of memory cells.

For example, the word line is enabled according to the output signal from the row decoder 600, and the memory cell in the memory array 620 is selected by the enabled word line. Accordingly, the sense amplifier 590 corresponding to the memory cell is operated. Here, data stored in the memory cell connected to the selected word line are transferred to the bit line. When the sense amplifier enable signal SAEN has a high level, the sense amplifier 590 sequentially receives the sense amplifier driving voltages Vcore1 and Vcore2, and starts sensing the bit line. Therefore, the data stored in the memory cell selected by the word line are refreshed for a predetermined time t1.

In addition, the sense amplifier control unit 580 sequentially supplies the sense amplifier driving voltages Vcore1 and Vcore2 to the sense amplifier 590 for the predetermined time t1. Especially, as compared with the conventional refresh control circuit supplying the sense amplifier driving voltage Vcore1 for delay time D1 (shown in FIG. 2), the refresh control circuit of the disclosure supplies the sense amplifier driving voltage Vcore1 for delay time D1+D2 (shown in FIG. 5).

Figure 4:
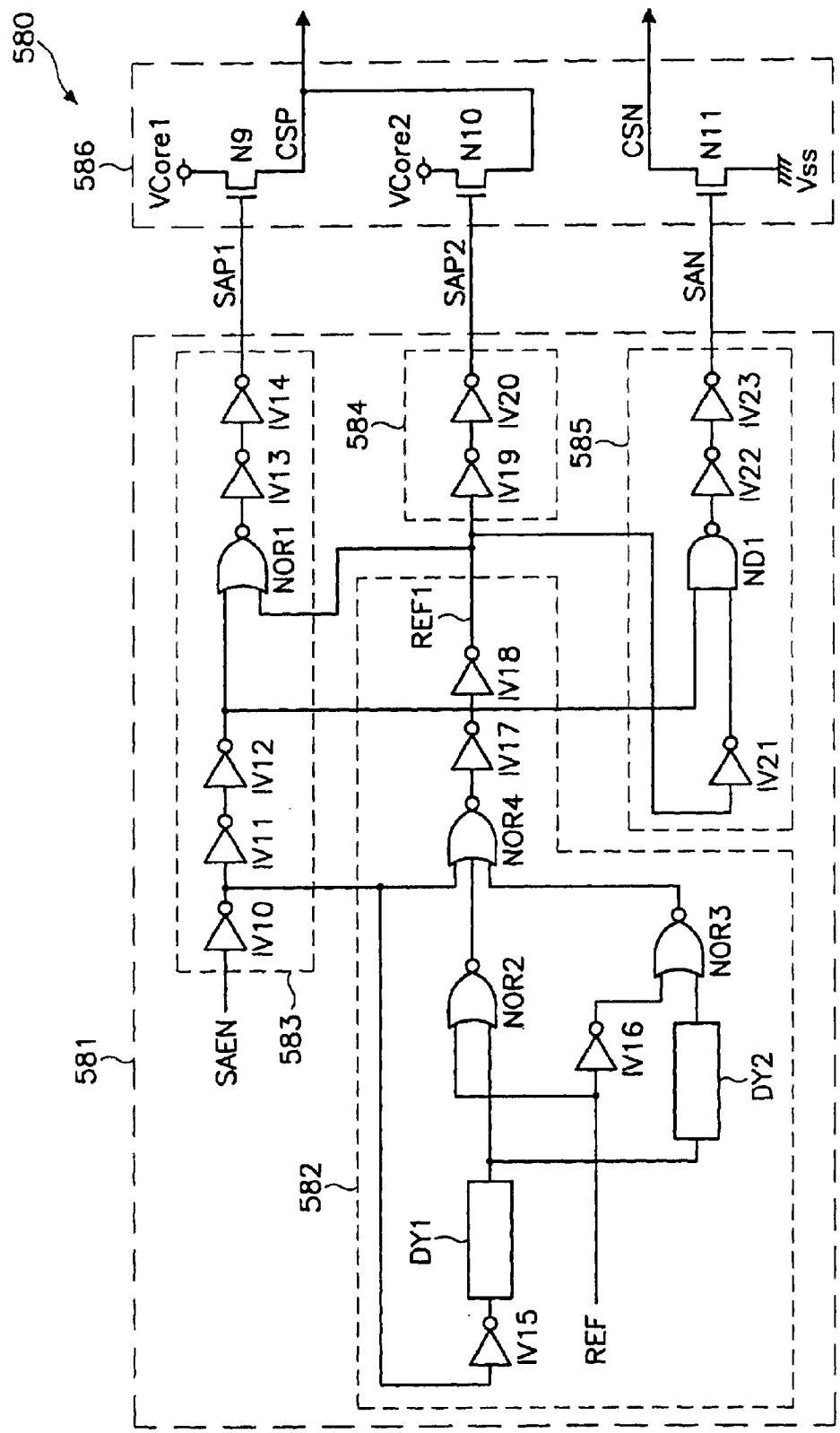
FIG. 4 is a circuit diagram illustrating a sense amplifier control unit of FIG. 3.

Referring to FIG. 4, the sense amplifier control unit 580 receives the refresh command signal REF, and supplies the sense amplifier driving voltage Vcore1 to the sense amplifier 590 for an additional delay time D2 in the whole cells during the refresh operation by delays DY1 and DY2. In particular, the sense amplifier control unit 580 includes a sense amplifier control circuit 581 and a sense amplifier driver 586. The sense amplifier control circuit 581 generates sense amplifier driving signals SAP1, SAP2, and SAN in response to the sense amplifier enable signal SAEN and the refresh command signal REF. The sense amplifier driver 586 supplies the sense amplifier driving voltages Vcore1, Vcore2, and Vss to the sense amplifier 590 to drive the sense amplifier 590 in response to the sense amplifier driving signals SAP1, SAP2, and SAN.

Here, the sense amplifier control circuit 581 includes a refresh command signal generating unit 582 configured to generate a refresh command signal REF1 by logically combining the sense amplifier enable signal SAEN and the refresh command signal REF, a sense amplifier driving signal generating unit 583 configured to generate the sense amplifier driving signal SAP1 by logically combining the sense amplifier enable signal SAEN and the refresh command signal REF1, a sense amplifier driving signal generating unit 584 configured to receive the refresh command signal REF1 and to generate the sense amplifier driving signal SAP2, and a sense amplifier driving signal generating unit 585 configured to generate the sense amplifier driving signal SAN by logically combining the sense amplifier enable signal SAEN and the refresh command signal REF1.

In the refresh command signal generating unit 582, an inverter IV15 re-inverts an inverted signal of the sense amplifier enable signal SAEN, and the delay DY1 for obtaining D1 delays the output signal from the inverter IV15. A NOR gate NOR2 NORs the output signal from the delay DY1 and the refresh command signal REF. An inverter IV16 inverts the refresh command signal REF. The delay DY2 for obtaining delay time D2 re-delays the output signal from the delay DY1. A NOR gate NR3 NORs the output signal from the inverter IV16 and the output signal from the delay DY2. A NOR gate NR4 NORs the inverted signal of the sense amplifier enable signal SAEN and the output signals from the NOR gates NR2 and NR3. The output signal from the NOR gate NR4 is outputted as the refresh command signal REF1 through inverters IV17 and IV18.

In the sense amplifier driving signal generating unit 583, the inverters IV10, IV11 and IV12 sequentially invert the sense amplifier enable signal SAEN. A NOR gate NR1 NORs the output signal from the inverter IV12 and the refresh command signal REF1. Inverters IV13 and IV14 sequentially invert the output signal from the NOR gate NR1 and output it as the sense amplifier driving signal SAP1.

The sense amplifier driving signal generating unit 584 outputs the refresh command signal REF1 as the sense amplifier driving signal SAP2 according to sequential inverting operations of inverters IV19 and IV20.

In the sense amplifier driving signal generating unit 585, an inverter IV21 inverts the output signal of the refresh command signal REF1. A NAND gate ND1 NANDs the output signals from the inverters IV21 and IV12. Inverters IV22 and IV23 sequentially invert the output signal from the NAND gate ND1, and outputs it as the sense amplifier driving signal SAN.

In the sense amplifier driver 586, an NMOS transistor N9 transmits the sense amplifier driving voltage Vcore1 to a sense amplifier power supply node CSP in response to the sense amplifier driving signal SAP1. An NMOS transistor N10 supplies the sense amplifier driving voltage Vcore2 to the sense amplifier power supply node CSP in response to the sense amplifier driving signal SAP2. An NMOS transistor N11 supplies the ground voltage Vss to the sense amplifier power supply node CSN in response to the sense amplifier driving signal SAN.

The sense amplifier control unit 580 generates the sense amplifier driving signals SAP1, SAP2, and SAN in response to the refresh command signal REF and the sense amplifier enable signal SAEN. The sense amplifier control unit 580 supplies the sense amplifier driving voltage Vcore1 to the sense amplifier power supply node CSP for delay times D1 and D2, and then supplies the sense amplifier driving voltage Vcore2 thereto according to the sense amplifier driving signals SAP1 and SAP2. That is, the sense amplifier driving voltage Vcore1 is supplied to the sense amplifier 590 for a sufficient time for the refresh operation (over supply time in the normal operation) in response to the refresh command signal REF, which in turn, refreshes the whole cells including the cells having the poor refresh property without failure.

Figure 5:
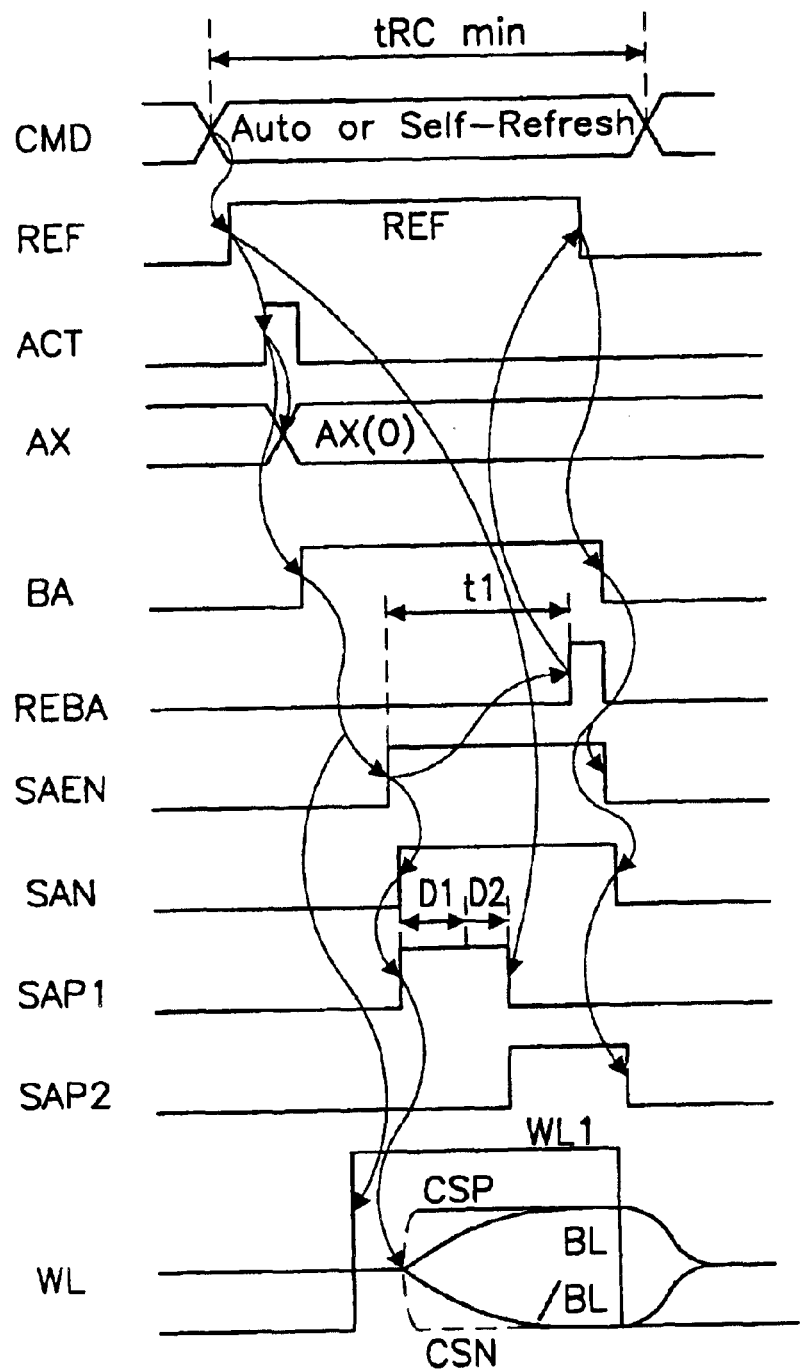
FIG. 5 is a timing view of the refresh control circuit for the semiconductor memory device.

As shown in FIG. 5, CMD includes an auto refresh command and a self refresh command. When the CMD is inputted, the refresh command signal REF is enabled. When the refresh command signal REF has a high level, the sense amplifier driving signals SAP1 and SAN have a high level for delay time D1+D2 and the sense amplifier driving signal SAP2 maintains a low level in response to the sense amplifier enable signal SAEN having a high level. Therefore, the sense amplifier power supply node CSP is gradually increased from precharged VDD/2 level to the sense amplifier driving voltage Vcore1 (higher than Vcore2). That is, the whole cells including the cells having the poor refresh property normally perform the refresh operation because the sense amplifier driving voltage Vcore1 is supplied to the sense amplifier for delay time D1+D2 to drive the sense amplifier in response to the refresh command signal REF (namely, the sense amplifier driving voltage Vcore1 is supplied to the sense amplifier for an additional delay time D2 to drive the sense amplifier).

Figure 6:
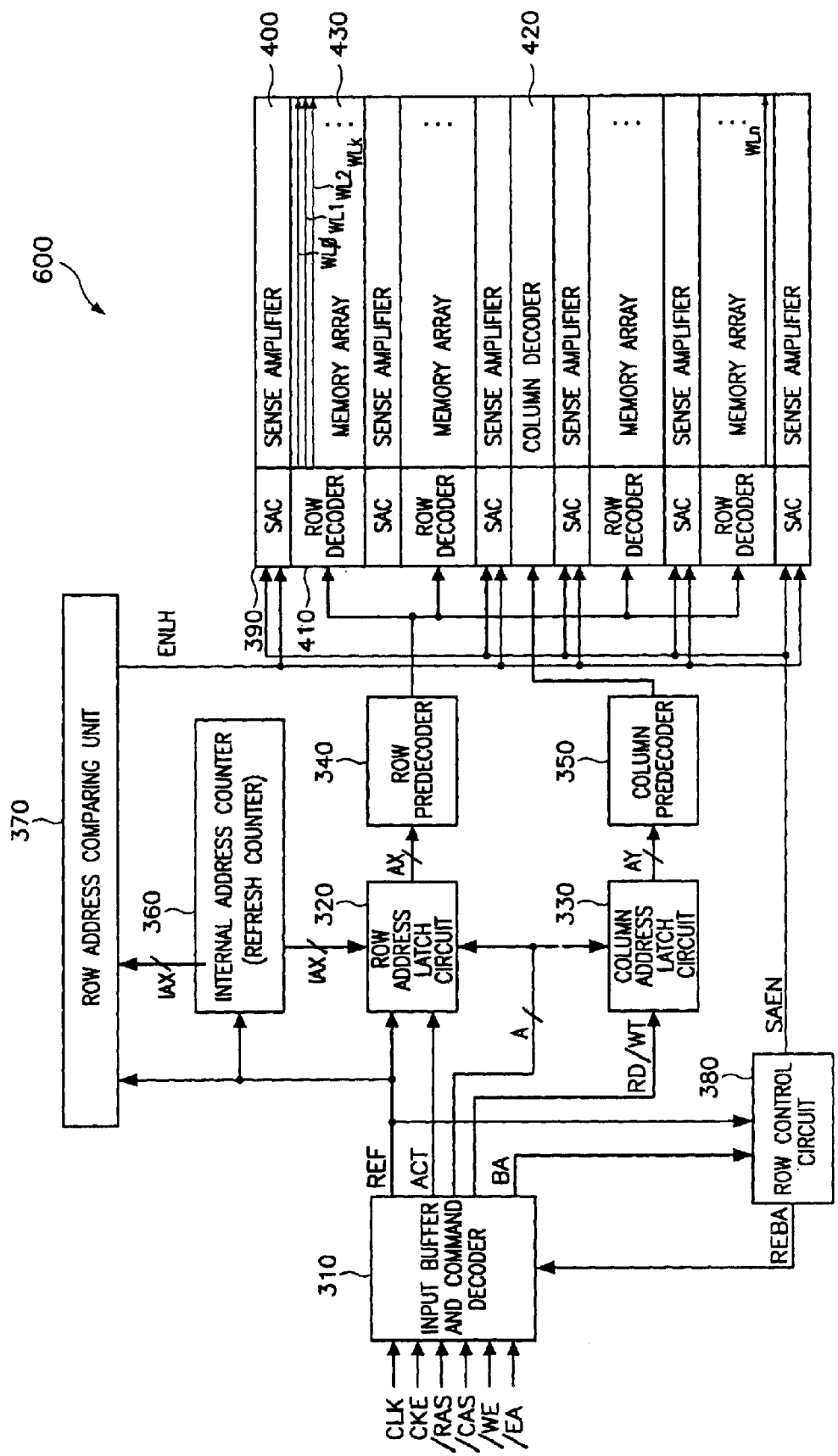
FIG. 6 is another block diagram illustrating a refresh control circuit for a semiconductor memory device.

Alternatively, the refresh control circuit 600 shown in FIG. 6 has the same structure as the refresh control circuit 300 shown in FIG. 3 except that the refresh control circuit 600 further includes a row address comparing unit 370 and a sense amplifier control unit 390. The refresh control circuit 600 uses a refresh fail detect signal ENLH from a row address comparing unit 370 instead of a refresh command signal REF.

Figure 1:
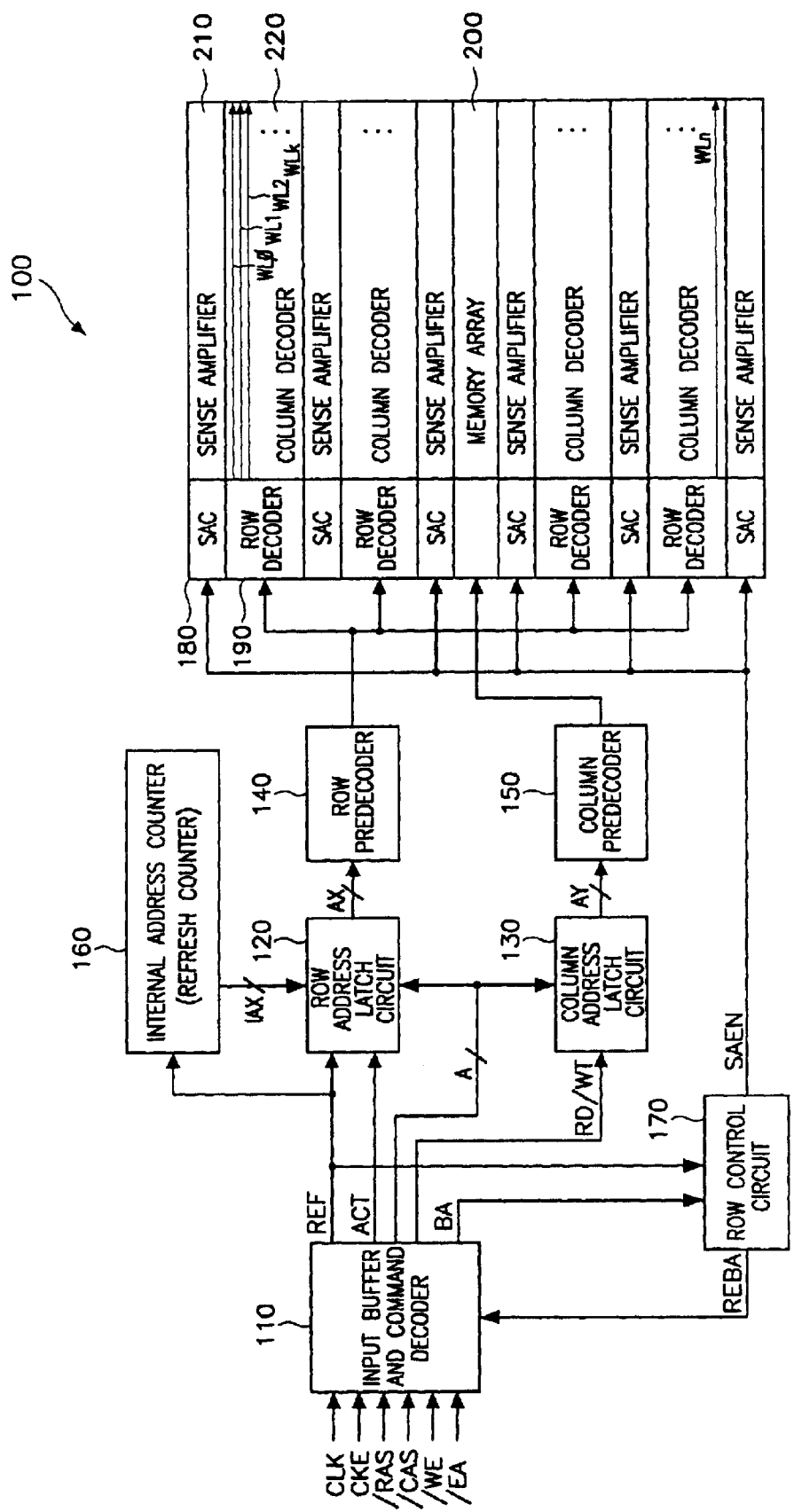
FIG. 1 is a block diagram illustrating a conventional refresh control circuit for a semiconductor memory device.
Figure 2:
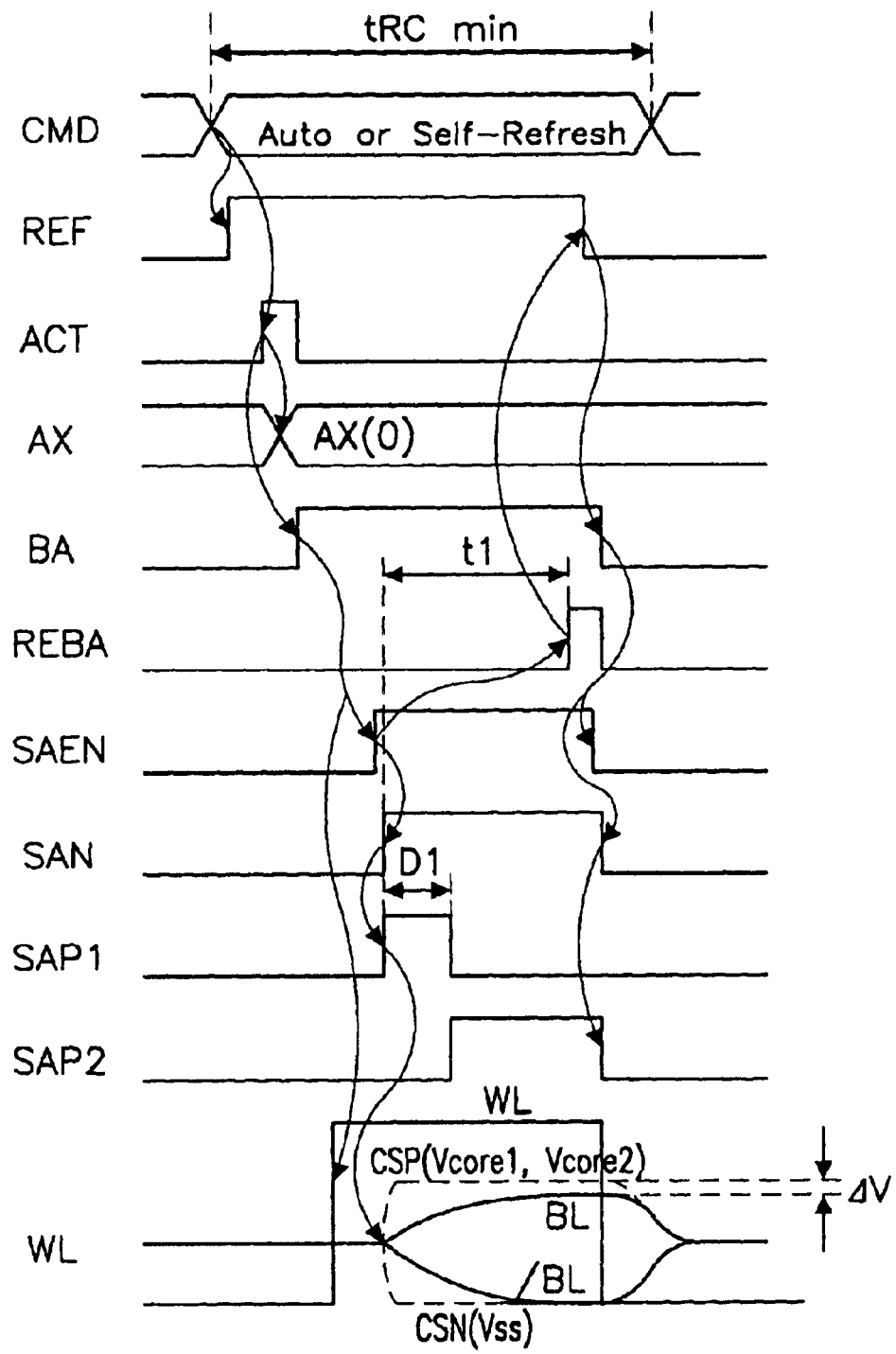
FIG. 2 is a timing view of signals of the conventional refresh control circuit shown in FIG. 1.

Referring to FIG. 6, a sense amplifier driving voltage Vcore1 for cells having a poor refresh property is supplied to a sense amplifier 400 by an additional delay time D2 than the conventional refresh control circuit (e.g., shown in FIG. 2). Thus, a bit line is developed in a sufficient level such that the cells having the poor refresh property are sufficiently refreshed.

Figure 7:
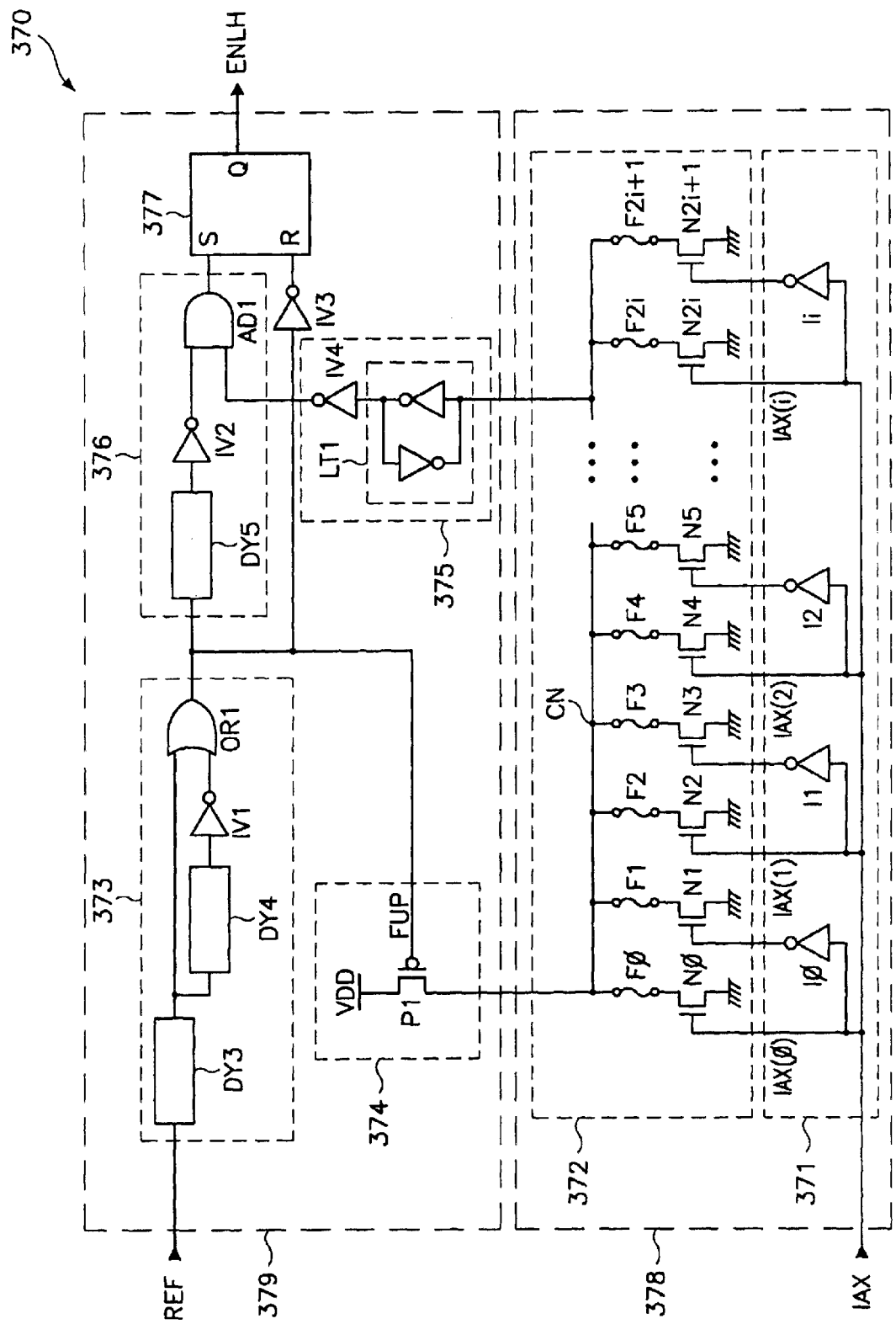
FIG. 7 is a circuit diagram illustrating a row address comparing unit of FIG. 6.

FIG. 7 is a circuit diagram illustrating the row address comparing unit 370 of FIG. 6. The row address comparing unit 370 compares a row address obtained through a test for the cells having the poor refresh property with an internal row address IAX, and generates the refresh fail detect signal ENLH when the two row addresses are identical. The row address comparing unit 370 includes a storing unit 378 configured to the row address having the refresh failure recorded in fuses F0–F2i+1, and a refresh fail detect unit 379 configured to detect the cell having the refresh failure in response to the refresh command signal REF and the output from the storing unit 378.

The storing unit 378 includes a decoding circuit 371 configured to decode the internal row addresses IAX(0)–IAX(i), and a fuse array 372 where the row address having the refresh failure is recorded. The fuse array unit 372 compares the output signal from the decoding circuit 371 with the row address having the refresh failure recorded in the fuses F0–F2i+1. Here, the decoding circuit 371 includes inverters I0–Ii configured to invert the internal row address IAX. The fuse array unit 372 includes fuses F0–F2i+1 and NMOS transistors N0–N2i+1 operated in response to the internal row addresses IAX(0)–IAX(i) and the output signals from the inverters I0–Ii. The fuses F0–F2i+1 are connected between each drain terminal of the NMOS transistors N0–N2i+1 and a common node CN.

The refresh fail detect unit 379 includes a first pulse generator 373 configured to generate a low pulse from the refresh command signal REF, a precharge unit 374 operated according to the low pulse from the first pulse generator 373 configured to precharge the common node CN of the fuse array unit 372 into VDD, a latch circuit 375 configured to maintain the precharged VDD level, a second pulse generator 376 configured to generate a high pulse by combining the low pulse from the first pulse generator 373 and the output signal from the latch circuit 375, and an RS latch circuit 377 configured to latch an inverted signal of the output signal from the first pulse generator 373 and the output signal from the second pulse generator 376.

In the first pulse generator 373, a delay DY3 delays the refresh command signal REF and a delay DY4 re-delays the output signal from the delay DY3. An inverter IV1 inverts the output signal from the delay DY4, and an OR gate OR1 ORs the output signal from the delay DY3 and the output signal from the inverter IV1. The precharge unit 374 operated by the low pulse from the first pulse generator 373 is composed of a PMOS transistor P1. The precharge unit 374 is configured to precharge the common node CN into the VDD level. The latch circuit 375 includes an inverter latch circuit LT1 and an inverter IV4 to maintain the precharged VDD level. In the second pulse generator 376, a delay circuit DY5 delays the output signal from the first pulse generator 373. An inverter IV2 inverts the output signal from the delay DY5, and an AND gate AD1 ANDs the output signal from the inverter IV2 and the output signal from the inverter IV4. The RS latch circuit 377 outputs the refresh fail detect signal ENLH by latching the output signal from the second pulse generator 376 and the output signal from the inverter IV3.

When the row address having the refresh failure recorded in the fuse array unit 372 is identical to the internal row address IAX(0)–IAX(i) during the refresh operation, the row address comparing unit 370 outputs the refresh fail detect signal ENLH in a high level to notify that the cell having the poor refresh property exists. When the two row addresses are different, the row address comparing unit 370 outputs the refresh fail detect signal ENLH in a low level.

Figure 8:
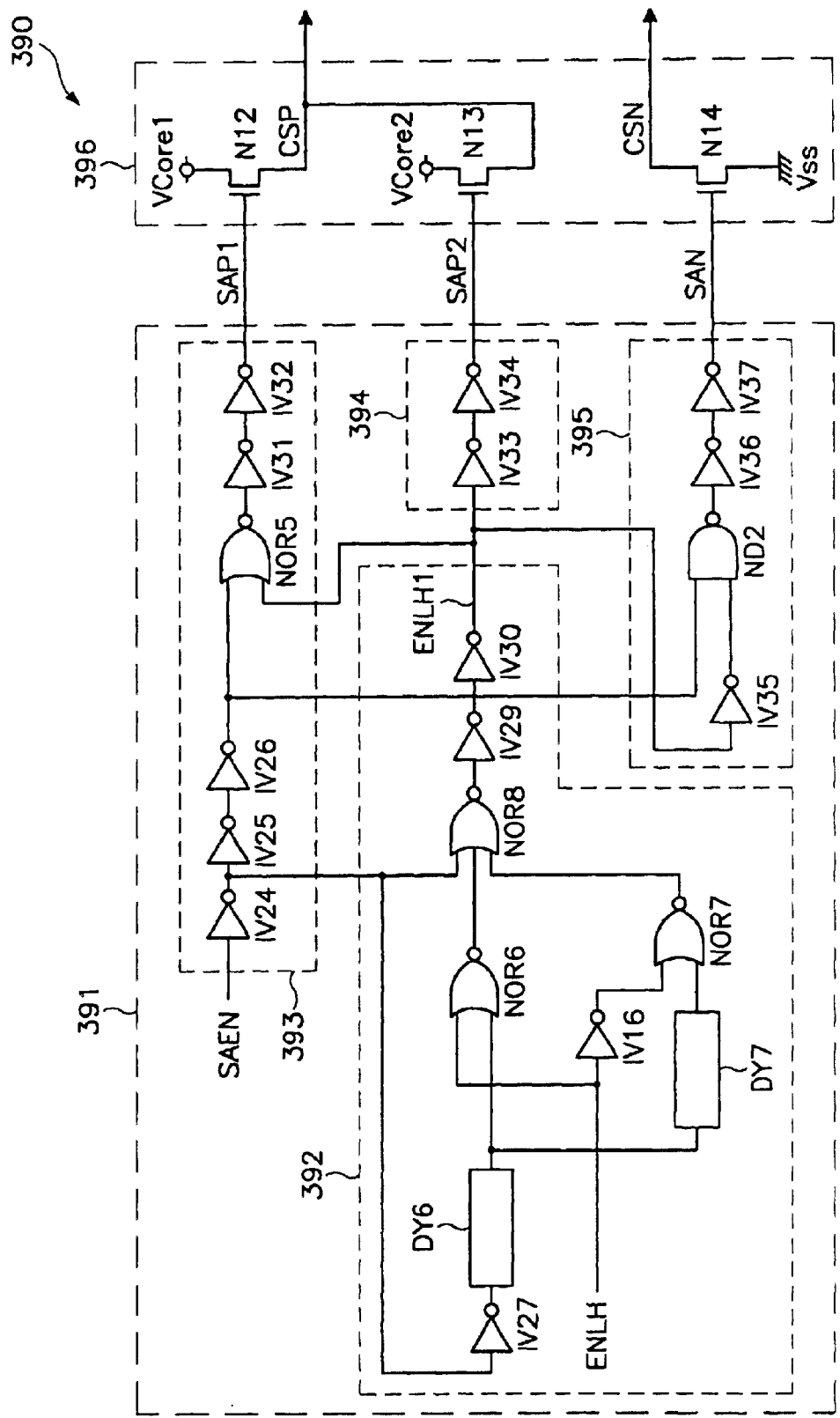
FIG. 8 is a circuit diagram illustrating a sense amplifier control unit of FIG. 6.

FIG. 8 is a circuit diagram illustrating the sense amplifier control unit 390 of FIG. 6. The sense amplifier control unit 390 receives the refresh fail detect signal ENLH, and outputs the sense amplifier driving signal SAP2 by applying the delay time D1 of a delay DY6 or the delay time D1+D2 of the delays DY6 and DY7 according to the state of the refresh fail detect signal ENLH. The sense amplifier control unit 390 includes a sense amplifier control circuit 391 and a sense amplifier driver 396. The sense amplifier control circuit 391 generates the sense amplifier driving signals SAP1, SAP2, and SAN in response to the sense amplifier enable signal SAEN and the refresh fail detect signal ENLH. The sense amplifier driver 396 supplies the sense amplifier driving voltages Vcore1, Vcore2, and Vss to the sense amplifier 400 to drive the sense amplifier 400 in response to the sense amplifier driving signals SAP1, SAP2 and SAN.

Here, the sense amplifier control circuit 391 includes a refresh fail detect signal generating unit 392 configured to generate a refresh fail detect signal ENLH1 by applying the delay time D1 of the delay DY6 or the delay time D1+D2 of the delays DY6 and DY7 by logically combining an inverted signal of the sense amplifier enable signal SAEN and the refresh fail detect signal ENLH, a sense amplifier driving signal generating unit 393 configured to generate the sense amplifier driving signal SAP1 by logically combining the sense amplifier enable signal SAEN and the refresh fail detect signal ENLH1, a sense amplifier driving signal generating unit 394 configured to receive the refresh fail detect signal ENLH1 and to generate the sense amplifier driving signal SAP2, and a sense amplifier driving signal generating unit 395 configured to generate the sense amplifier driving signal SAN by logically combining an inverted signal of the sense amplifier enable signal SAEN and the refresh fail detect signal ENLH1.

The sense amplifier control unit 390 shown in FIG. 8 has the same structure as the sense amplifier control unit of FIG. 4 except that the sense amplifier control unit 390 receives the refresh fail detect signal ENLH instead of the refresh command signal REF. Accordingly, detailed explanations thereof are omitted.

As described above, the sense amplifier control unit 390 generates the sense amplifier driving signals SAP1, SAP2, and SAN in response to the refresh fail detect signal ENLH and the sense amplifier enable signal SAEN, and sequentially supplies the sense amplifier driving voltage Vcore1 and Vcore2 to the sense amplifier power supply node CSP according to the sense amplifier driving signals SAP1 and SAP2. That is, the sense amplifier driving voltage Vcore1 is supplied to the sense amplifier for delay time D1 or delay time D1+D2 during the refresh operation in response to the refresh fail detect signal ENLH for notifying that the cell having the poor refresh property exists. Thus, the cell having the poor refresh property can normally perform the refresh operation.

Figure 9:
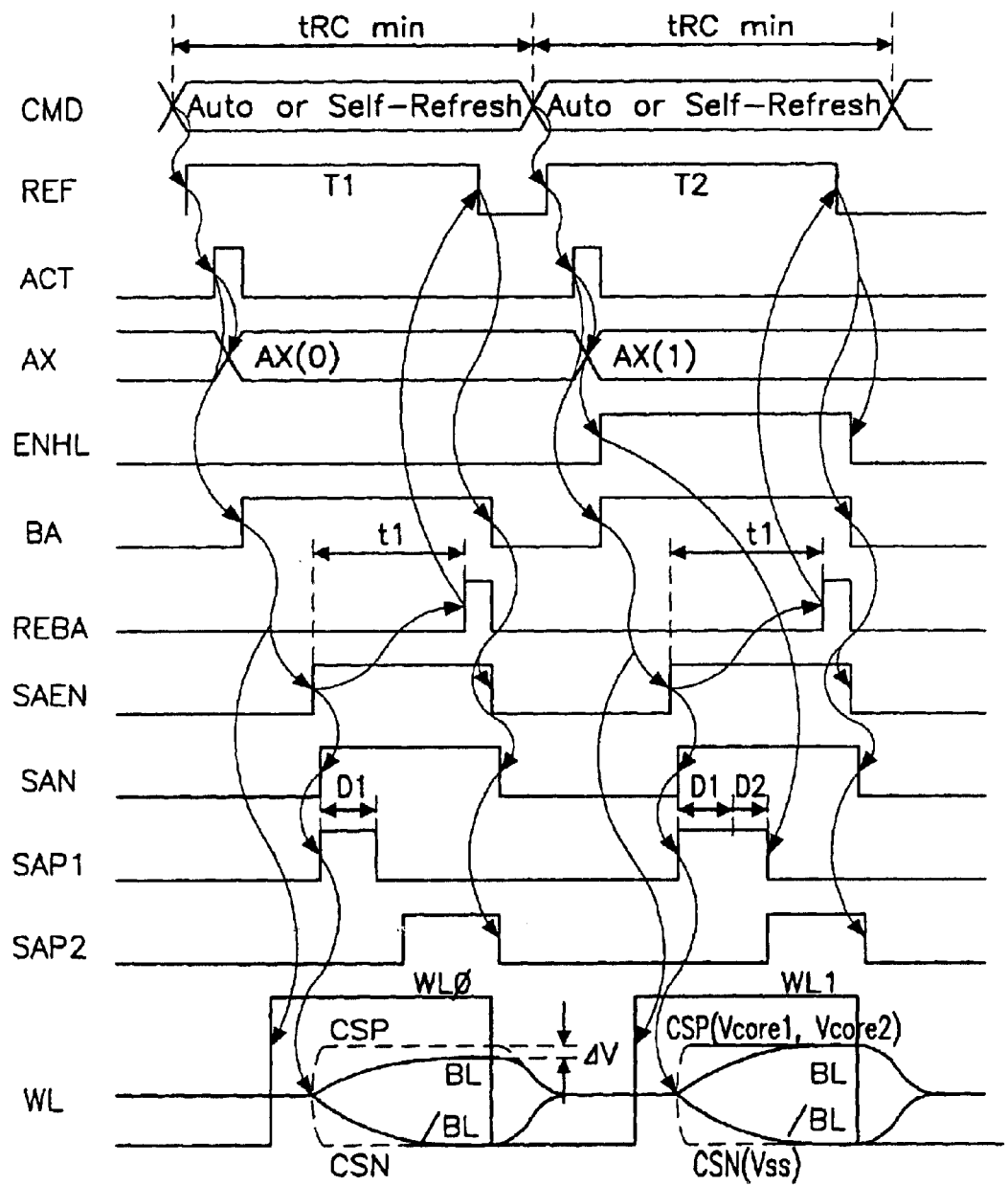
FIG. 9 is a timing view of the refresh control circuit for the semiconductor memory device.

As shown in FIG. 9, the refresh command signal REF can be explained in T1 period and T2 period. The T1 refresh period is a timing view for the cell having the good refresh property, and the T2 refresh period is a timing view for the cell having the poor refresh property. In particular, the T1 refresh period shows a state where the row address having the refresh failure previously recorded in the fuses through the test is not identical to the internal row address IAX(0)–IAX(i) for the refresh operation. Conversely, the T2 refresh period shows a state where the row address having the refresh failure previously recorded in the fuses through the test is identical to the internal row address IAX(0)–IAX(i) for the refresh operation.

When the row addresses are identical in the T2 refresh period, the refresh fail detect signal ENLH has a high level. Accordingly, the sense amplifier driving signals SAP1 and SAN have a high level for delay time D1+D2, and the sense amplifier driving signal SAP2 maintains a low level when the sense amplifier enable signal SAEN has a high level. Therefore, the sense amplifier driving voltage Vcore1 is supplied to the sense amplifier, and the word line is gradually increased from the precharged VDD/2 level to the sense amplifier driving voltage Vcore1 (higher than Vcore2) while the sense amplifier driving signal SAP1 is transmitted to the sense amplifier power supply node CSP in a high level. That is, when the word line of the cell having the poor refresh property is refreshed (T2 refresh period), the sense amplifier driving voltage Vcore1 is supplied to the sense amplifier for delay time D1+D2 differently from the T1 refresh period (namely, the sense amplifier driving voltage Vcore1 is supplied to the sense amplifier for an additional delay time D2 to drive the sense amplifier). Thus, the cell having the poor refresh property is sufficiently refreshed according to the sense amplifier driving voltage Vcore1 supplied for an extended period of time.

As discussed earlier, the sense amplifier driving voltage is supplied to the sense amplifier for an additional delay time D2 to drive the sense amplifier during the refresh operation. As a result, the refresh property of the whole cells including the cells having the poor refresh property may be improved.

Many changes and modifications to the embodiments described herein could be made. The scope of some changes is discussed above. The scope of others will become apparent from the appended claims.

What is claimed is:

1. A refresh control circuit for a semiconductor memory device, the circuit comprising:

a sense amplifier control circuit configured to generate a sense amplifier driving signal by selectively applying a first delay time and a second delay time in response to a sense amplifier enable signal and a refresh command signal, wherein the second delay time is a sum of the first delay time and a third delay time having a positive value; and a sense amplifier driver configured to output a sense amplifier driving voltage by applying the first delay time in a normal operation and the second delay time in a refresh operation, wherein the sense amplifier control circuit comprises:

a refresh command signal generating unit configured to output a first refresh command signal for selectively applying the first delay time and the second delay time in response to the sense amplifier enable signal and the refresh command signal;

a first sense amplifier driving signal generating unit configured to generate a first sense amplifier driving signal by logically combining the sense amplifier enable signal and the first refresh command signal;

a second sense amplifier driving signal generating unit for delaying the first refresh command signal for a predetermined time and generating a second sense amplifier driving signal; and a third sense amplifier driving signal generating unit configured to generate a third sense amplifier driving signal by logically combining the first refresh command and the sense amplifier enable signal.

2. The circuit according to claim 1, wherein the refresh command signal generating unit comprises:

a first delay unit configured to delay the sense amplifier enable signal for the first delay time;

a second delay unit configured to delay the output from the first delay unit for the third delay time;

a first operation unit configured to operate the output signal from the first delay unit and the refresh command signal;

a second operation unit configured to operate the output from the second delay unit and the refresh command signal; and a third operation unit configured to output the first refresh command signal by applying the first delay time or the second delay time according to the normal operation and the refresh operation by combining the output signals from the first operation unit and the second operation unit and the sense amplifier enable signal.

3. The circuit according to claim 1, wherein the sense amplifier driver comprises:

a first transistor configured to switch an output of a first sense amplifier driving voltage to a first node in response to the first sense amplifier driving signal;

a second transistor configured to switch an output of a second sense amplifier driving voltage lower than the first sense amplifier driving voltage to the first node in response to the second sense amplifier driving signal; and a third transistor configured to switch an output of a ground voltage to a second node in response to the third sense amplifier driving signal.

4. A refresh control circuit for a semiconductor memory device, the circuit comprising a row address comparing unit configured to compare a row address having previously-recorded refresh failure with an internal row address, and to generate a refresh fail detect signal in response to a refresh command signal; and a sense amplifier control unit configured to output a sense amplifier driving voltage by applying a first delay time in a refresh operation for a general row address and a second delay time in a refresh operation for the row address having the previously-recorded refresh failure in response to the refresh fail detect signal and a sense amplifier enable signal, the second delay time comprising the first delay time and a third delay time.

5. The circuit according to claim 4, wherein the row address comparing unit comprises:

a storing unit synchronized with the refresh command signal, the storing unit being configured to compare the row address having the previously-recorded failure with the internal row address; and a refresh fail detect unit synchronized with the refresh command signal, the refresh fail detect unit being configured to output the refresh fail detect signal corresponding to the output signal from the storing unit.

6. The circuit according to claim 5, wherein the storing unit stores the row address having the refresh failure in a plurality of fuses.

7. The circuit according to claim 5, wherein the storing unit comprises:

a decoding circuit configured to decode the internal row address; and a fuse array unit where the row address having the refresh failure is recorded, the fuse array unit for comparing the output signal from the decoding circuit with the row address having the refresh failure recorded in the fuses.

8. The circuit according to claim 5, wherein the refresh fail detect unit comprises:

a first pulse generator configured to generate a low pulse in response to the refresh command signal;

a precharge unit configured to precharge a common node into VDD level in response to the low pulse;

a latch circuit configured to maintain the precharged VDD level;

a second pulse generator configured to generate a high pulse by logically combining the output signal from the first pulse generator and the output signal from the latch circuit; and an RS latch circuit configured to latch the output signal from the second pulse generator and an inverted signal of the output signal from the first pulse generator.

9. The circuit according to claim 4, wherein the sense amplifier control unit comprises:

a sense amplifier control circuit configured to generate a sense amplifier driving signal by selectively applying the first delay time and the second delay time in response to the sense amplifier enable signal and the refresh fail detect signal; and a sense amplifier driver configured to output the sense amplifier driving voltage by applying the first delay time in the refresh operation for the general row address and the second delay time in the refresh operation for the row address having the previously-recorded failure in response to the sense amplifier driving signal.

10. The circuit according to claim 9, wherein the sense amplifier control circuit comprises:

a refresh fail detect signal generating unit configured to output a first refresh fail detect signal for selectively applying the first delay time and the second delay time in response to the sense amplifier enable signal and the refresh fail detect signal;

a first sense amplifier driving signal generating unit configured to generate a first sense amplifier driving signal by logically combining the sense amplifier enable signal and the first refresh fail detect signal;

a second sense amplifier driving signal generating unit configured to generate a second sense amplifier driving signal in response to the first refresh fail detect signal; and a third sense amplifier driving signal generating unit configured to generate a third sense amplifier driving signal by logically combining the first refresh fail detect signal and the sense amplifier enable signal.

11. The circuit according to claim 10, wherein the refresh fail detect signal generating unit comprises:

a first delay unit configured to delay the sense amplifier enable signal for the first delay time;

a second delay unit configured to delay the output from the first delay unit for the third delay time;

a first operation unit configured to operate the output signal from the first delay unit and the refresh fail detect signal;

a second operation unit configured to operate the output from the second delay unit and the refresh fail detect signal; and a third operation unit configured to output the first refresh fail detect signal by applying the first delay time or the second delay time according to the refresh operation for the general row address and the refresh operation for the row address having the previously-recorded refresh failure by combining the output signals from the first operation unit and the second operation unit and the sense amplifier enable signal.

12. The circuit according to claim 10, wherein the sense amplifier driver comprises:

a first transistor configured to switch an output of a first sense amplifier driving voltage to a first node in response to the first sense amplifier driving signal;

a second transistor configured to switch an output of a second sense amplifier driving voltage lower than the first sense amplifier driving voltage to the first node in response to the second sense amplifier driving signal; and a third transistor configured to switch an output of a ground voltage to a second node in response to the third sense amplifier driving signal.

13. A refresh control method for a semiconductor memory device, the method comprising:

generating an internal row address for a refresh operation in response to a refresh command signal;

generating a refresh fail detect signal by comparing a row address having previously-recorded failure with the internal row address in a refresh operation; and driving a sense amplifier by supplying an initial sense amplifier driving voltage for the row address having the previously-recorded refresh failure longer than for a general row address in response to the refresh fail detect signal in the refresh operation.

14. The method according to claim 12, further comprising a step for recording the row address having the refresh failure obtained through a test in fuses.

* * * * *